United States Patent [19]
Kobatake

[11] Patent Number: 5,880,995
[45] Date of Patent: Mar. 9, 1999

[54] NONVOLATILE SEMICONDUCTOR STORAGE INCLUDING MAIN DECODER WITH PREDECODER

[75] Inventor: Hiroyuki Kobatake, Tokyo, Japan

[73] Assignee: NEC Corporation, Tokyo, Japan

[21] Appl. No.: 49,124

[22] Filed: Mar. 27, 1998

[30] Foreign Application Priority Data

Apr. 1, 1997 [JP] Japan ................................. 9-082843

[51] Int. Cl.$^6$ ................................................ G11C 16/06
[52] U.S. Cl. .......................... 365/185.23; 365/185.23; 365/185.11; 365/230.06
[58] Field of Search ....................... 365/185.11, 185.23, 365/230.06

[56] References Cited

U.S. PATENT DOCUMENTS

| | | | |
|---|---|---|---|
| 5,233,565 | 8/1993 | Wang | 365/233.5 |
| 5,619,450 | 4/1997 | Takeguchi | 365/185.23 |
| 5,654,925 | 8/1997 | Koh et al. | 365/201 |

FOREIGN PATENT DOCUMENTS 6-215591  8/1994  Japan .

OTHER PUBLICATIONS

"A 5–V–Only Operation 0.6–μm Flash EEPROM with Row Decoder Scheme in Triple–Well Structure" by A. Umezawa et al., IEEE Journal of Solid–State Circuits, vol. 27, No. 11, Nov. 1992, pp. 1540–1546.

Primary Examiner—David Nelms
Assistant Examiner—VanThu Nguyen
Attorney, Agent, or Firm—McGinn & Gibb, P.C.

[57] ABSTRACT

A nonvolatile semiconductor storage includes a memory cell array provided with a plurality of memory cell transistors including a plurality of blocks and arranged in each block as a matrix with rows and columns, and with a plurality of N-channel transistors whose sources are connected to an auxiliary bit line common to the drains of the memory cell transistors of each column. A word line is connected to control gates of memory cell transistors of each row of the memory cell array in common. A main bit line is connected to drains of N-channel transistors of each column of the memory cell array in common. An X decoder includes a predecoder for selecting a predetermined word line in accordance with an input address, a block decoder for selecting a block by outputting a block selection signal to the N-channel transistor of a predetermined block in accordance with an input address, and a main decoder for selecting a predetermined word line in accordance with the output of the predecoder or the block decoder. The main decoder includes a first N-channel transistor whose drain is connected to a corresponding output of the predecoder, whose source is connected to one corresponding word line, and to whose gate a block selection signal is input for each word line, a first P-channel transistor whose drain is connected to a corresponding output of the predecoder, whose source is connected to one corresponding word line, and to whose gate the inverted signal of said block selection signal is input, and a second N-channel transistor whose drain is connected to one corresponding word line, whose source is grounded, and to whose gate the inverted signal of the block selection signal is input, for each word line.

7 Claims, 5 Drawing Sheets

PRIOR ART

F I G. 5B

PRIOR ART

NONVOLATILE SEMICONDUCTOR STORAGE INCLUDING MAIN DECODER WITH PREDECODER

BACKGROUND OF THE INVENTION

The present invention relates to an electrically erasable programmable nonvolatile semiconductor storage (flash EEPROM).

A flash EEPROM has a memory cell transistor having a stack structure, in which data is written by channel hot electrons and erased by Fowler-Nordheim tunnel current. This type of memory requires an X (row) decoder for selecting a word line when writing or erasing data. However, data erasing for a conventional flash EEPROM is considered by assuming batch erasing of all bits and therefore, it cannot correspond to block erasing in a minute unit. Therefore, a memory realizing block erasing in a minute unit is proposed (official gazette of Japanese Patent Laid-Open No. 6-215591).

Figure 5A:
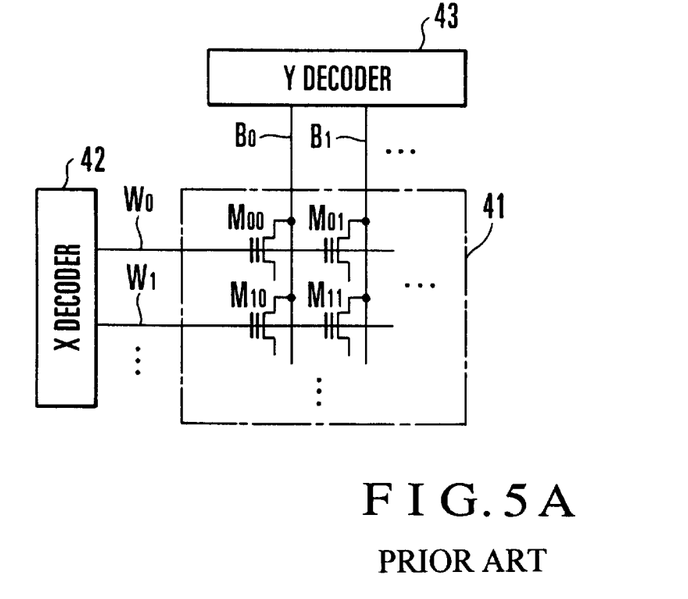
FIGS. 5A and 5B are a block diagram of a conventional flash EEPROM and a block diagram of an X decoder.
Figure 5B:
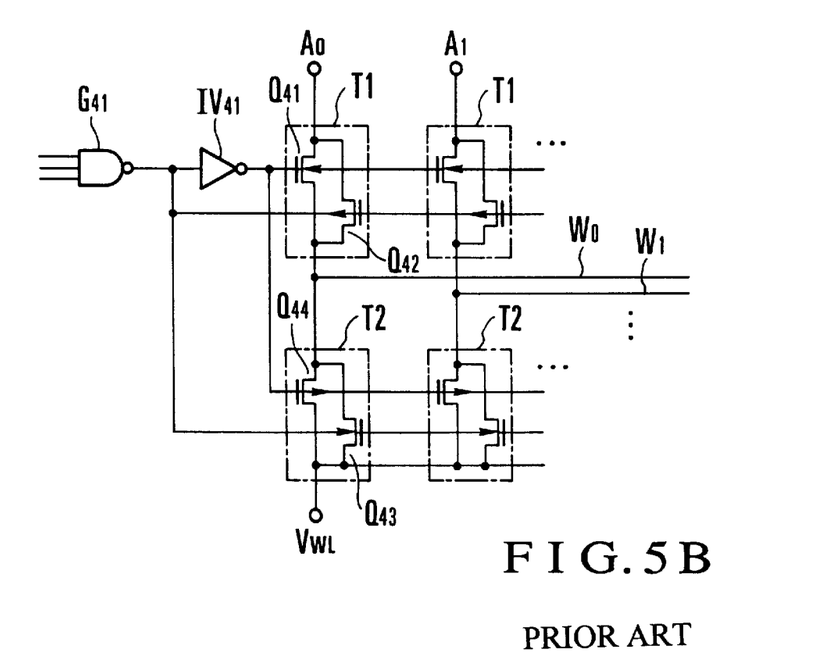

FIG. 5A is a block diagram of the flash EEPROM disclosed in the official gazette of Japanese Patent Laid-Open No. 6-215591) and FIG. 5B is a block diagram of the X decoder of the flash EEPROM.

The flash EEPROM comprises a memory cell array 41 in which memory cell transistors M00 to M11 are arranged like a matrix, word lines W0 and W1 connected to the control gate of the memory cell transistor of each row in common, bit lines B0 and B1 connected to the drain of the memory cell transistor of each column in common, an X decoder 42 for selecting a predetermined word line in accordance with an X address supplied from an external unit, and a Y decoder 43 for selecting a predetermined bit line in accordance with a Y address supplied from an external unit.

The X decoder 42 comprises a predecoder circuit (not shown), a NAND gate G41, an inverter gate IV41 for inverting an output signal of the NAND gate G41, and two transfer gates T1 and T2 respectively provided for each word line. Moreover, the transfer gate T1 comprises an N-channel MOS transistor Q41 and a P-channel MOS transistor Q42 and the transfer gate T2 comprises an N-channel MOS transistor Q43 and a P-channel MOS transistor Q44. Moreover, the NAND gate G41 and inverter gate IV41 are provided every predetermined number of word lines.

In outputs A0 and A1 of the predecoder circuit, a positive voltage (5 V for data read or 12 V for data write) is output from an output corresponding to a selected word line when data is read or written and −10 V is output when data is erased. Moreover, 0 V is output from an output corresponding to a nonselected word line when data is read or written and 3 V is output when data is erased.

Moreover, a voltage VWL supplied to the sources of the transistors Q43 and Q44 from a power supply (not shown) becomes 3 V when data is erased and becomes 0 V except the time when data is erased.

In the case of the above memory, because an "H"-level signal is input to every NAND gate G41 of a block including a selected word line, the output signal of the inverter gate IV41 of the block becomes "H"-level. Thereby, T1 of the transfer gates T1 and T2 is turned on.

Moreover, because an "L"-level signal is input to every NAND gate G41 of a block including a nonselected word line, the output signal of the inverter gate IV41 of the block becomes "L"-level. Thereby, T2 of the transfer gates T1 and T2 is turned on.

Thus, when data is read or written, a positive voltage (5 V for data read or 12 V for data write) supplied from the predecoder circuit is output to the selected word line through the transfer gate T1 and 0 V supplied from the predecoder circuit or an internal power supply is output to the nonselected word line through the transfer gate T1 or T2.

Moreover, when data is erased, −10 V supplied from the predecoder circuit is output to the selected word line through the transfer gate T1 and 3 V supplied from the predecoder circuit or the internal power supply is output to the nonselected word line through the transfer gate T1 or T2. Thus, it is possible to erase data in blocks including a plurality of word lines.

A voltage of 3 V is supplied to the nonselected word line when data is erased in order to apply a voltage higher than 0 V to the control gate of a nonselected memory cell transistor and decrease the potential difference between a source and a gate so that erroneous erasing (drain disturbing phenomenon) does not occur in the nonselected memory cell.

SUMMARY OF THE INVENTION

As described above, a conventional flash EEPROM has problems that wiring for supplying a voltage VWL of 3 or 0 V is necessary in an X decoder in order to prevent the drain disturbing phenomenon and thereby, the X decoder becomes complex and a power supply for generating the voltage VWL is necessary.

The present invention is made to solve the above problems and its object is to provide a nonvolatile semiconductor storage comprising a memory cell array provided with a plurality of memory cell transistors including a plurality of blocks and arranged in each block like a matrix and with a plurality of N-channel transistors whose sources are connected to an auxiliary bit line common to the drains of the memory cell transistors of each column; a word line connected to control gates of memory cell transistors of each row of a memory cell array in common; a main bit line connected to drains of N-channel transistors of each column of a memory cell array in common; and an X decoder including a predecoder for selecting a predetermined word line in accordance with an input address, a block decoder for selecting a block by outputting a block selection signal to the N-channel transistor of a predetermined block in accordance with an input address, and a main decoder for selecting a predetermined word line in accordance with the output of the predecoder or block decoder; wherein the main decoder has a first N-channel transistor whose drain is connected to a corresponding output of the predecoder, whose source is connected to one corresponding word line, and to whose gate a block selection signal is input for each word line, a first P-channel transistor whose drain is connected to a corresponding output of the predecoder, whose source is connected to one corresponding word line, and to whose gate an inverted signal of the block selection signal is input, and a second N-channel transistor whose drain is connected to one corresponding word line, whose source is grounded, and to whose gate the inverted signal of the block selection signal is input, for each word line.

As described, the present invention comprises a plurality of blocks and further comprises a memory cell array provided with a plurality of memory cell transistors arranged in each block like a matrix and a plurality of N-channel transistors whose sources are connected to a common auxiliary bit line to the drains of the memory cell transistors of each column, a word line connected to control gates of memory cell transistors of each row of the memory cell array in common, a main bit line connected to drains of N-channel transistors of each column of the memory cell array in common, and an X decoder including a predecoder for selecting a predetermined word line in accordance with an input address, a block decoder for selecting a block by outputting a block selection signal to the N-channel transistor of a predetermined block in accordance with an input address, and a main decoder for selecting a predetermined word line in accordance with the output of the predecoder or block decoder; wherein the main decoder is provided with a first N-channel transistor whose drain is connected to a corresponding output of the predecoder, whose source is connected to one corresponding word line, and to whose gate a block selection signal is input for each word line, a first P-channel transistor whose drain is connected to a corresponding output of the predecoder, whose source is connected to one corresponding word line, and to whose gate the inverted signal of the block selection signal is input, and a second N-channel transistor whose drain is connected to one corresponding word line, whose source is grounded, and to whose gate the inverted signal of the block selection signal is input.

A block selection signal (VDD/VPP) is output from a block decoder corresponding to a block including a selected word line. As a result, the N-channel transistor of the block including the selected word line is turned on and only the auxiliary bit line of a selected block is connected to the main bit line. A positive voltage VDD is output from an output corresponding to the selected word line out of the outputs of the predecoder when data is read, a positive voltage VPP or negative voltage VEE is output from the output when data is written, and a negative voltage VEE or positive voltage VPP is output from the output when data is erased. Moreover, 0 V is output from an output corresponding to a nonselected word line when data is read, written, or erased. Thereby, transfer gates (the first N-channel transistor and first P-channel transistor) corresponding to a block including a selected word line of the main decoder are turned on, a positive or negative voltage is output to the selected word line through a transfer gate, and 0 V is output to the nonselected word line through a transfer gate. Moreover, the second N-channel transistor corresponding to a block including no selected word line of the main decoder is turned on and 0 V is output to the nonselected word line through the second N-channel transistor.

Moreover, the main decoder is provided with a second P-channel transistor whose drain is connected to one corresponding word line, whose source is grounded, and to whose gate the block selection signal is input for each word line.

Furthermore, the main decoder is provided with a third N-channel transistor which has a NAND gate for computing the NOR of an address input to the block decoder for each word line, an inverter gate for inverting an output signal of the NAND gate, and whose drain is connected to the output of the inverter gate, whose source is connected to one corresponding word line, and to whose gate a read signal showing a read mode is input.

DESCRIPTION OF THE PREFERRED EMBODIMENTS

Figure 1:
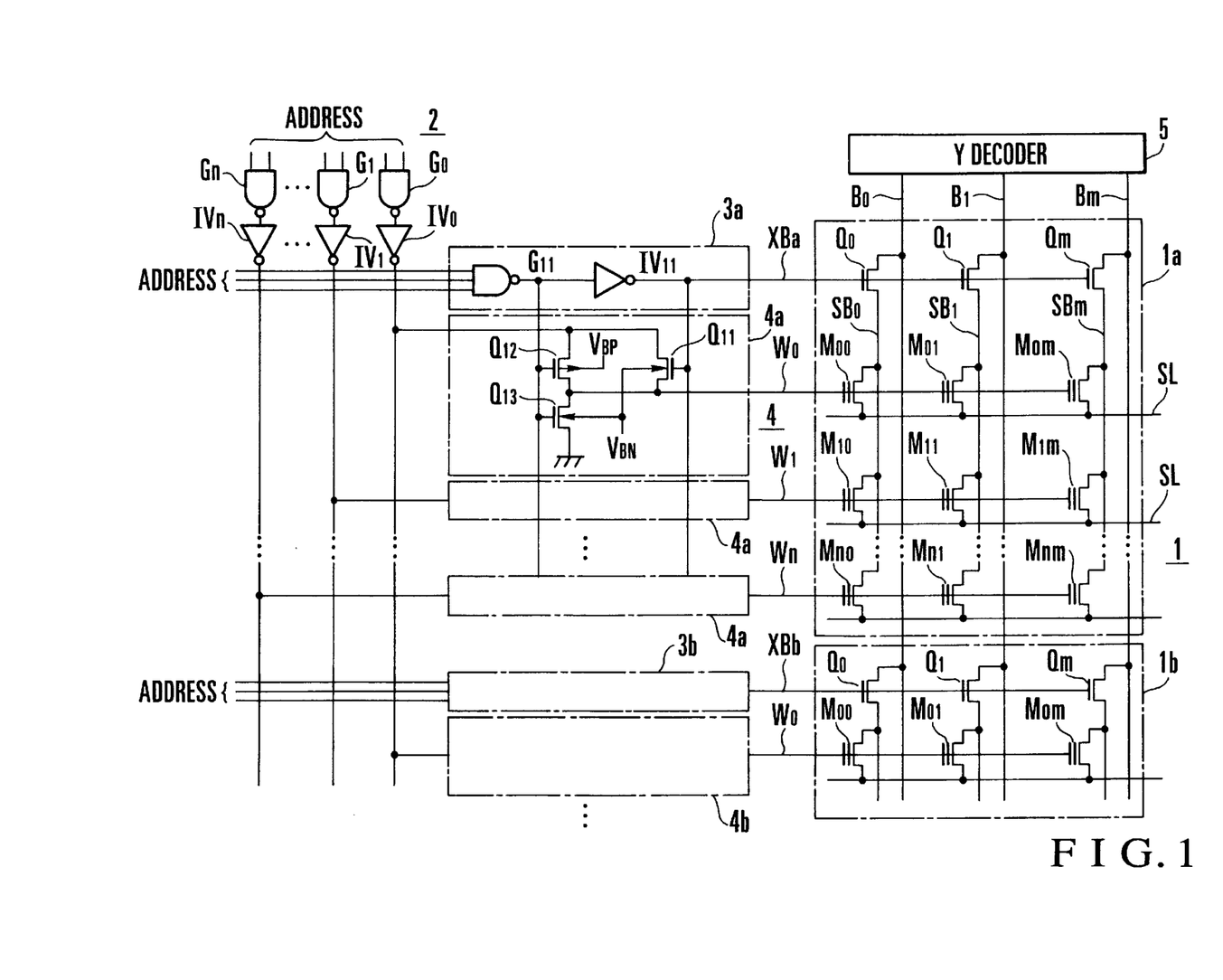
FIG. 1 is a block diagram of a flash EEPROM showing the first embodiment of the present invention.

The preferred embodiments of the present invention are described below by referring to the accompanying drawings. FIG. 1 is a block diagram of the flash EEPROM showing the first embodiment of the present invention.

The semiconductor storage comprises a memory cell array 1, word lines W0 to Wn, main bit lines B0 to Bm, a source line SL, an X(row) decoder for selecting a predetermined word line in accordance with an X address supplied from an external unit, and a Y(column) decoder 5 for selecting a predetermined main bit line in accordance with a Y address supplied from an external unit.

The memory cell array 1 comprises a plurality of blocks 1a, 1b, . . . and includes a plurality of N-channel MOS transistors Q0 to Qm which have a plurality of memory cell transistors M00 to Mnm arranged in each block like a matrix and whose sources are connected to auxiliary bit lines SB0 to SBm common to the drains of memory cell transistors M00 to Mn0, M00 to Mn1, and M0m to Mnm of each column.

The word lines W0 to Wn are respectively connected to the control gates of memory cell transistors M00 to M0m, M10 to M1m, and Mn0 to Mnm of each row.

Moreover, the sources of the memory cell transistors M00 to M0m, M10 to M1m, and Mn0 to Mnm of each row are connected to a source line SL.

The X decoder comprises a predecoder circuit 2 for selecting a predetermined word line in accordance with an X address supplied from an external unit, block decoder circuits 3a and 3b provided for every blocks 1a and 1b of the memory cell array 1, and a main decoder circuit 4 for selecting a predetermined word line in accordance with the output of the predecoder circuit or block decoder circuit.

The predecoder circuit 2 comprises NAND gates G0 to Gn respectively using an X address supplied from an external unit as an input and inverter gates IV0 to IVn using output signals of the NAND gates G0 to Gn as inputs. Each output of the predecoder circuit 2, that is, each output of the inverter gates IV0 to IVn corresponds to the word lines W0 to Wn respectively.

The block decoder circuits 3a and 3b are provided for every blocks 1a and 1b of the memory cell array 1 and each block decoder circuit comprises a NAND gate G11 using an X address supplied from an external unit as an input and an inverter gate IV11 using an output signal of the NAND gate G11 as an input.

Moreover, the output lines (output of the gate IV11) of the block decoder circuits 3a and 3b are connected to the gates of the N-channel transistors Q0 to Qm in the blocks 1a and 1b corresponding as block selection lines XBa and XBb.

The main decoder circuit 4 comprises structural units 4a and 4b respectively corresponding to the blocks 1a and 1b and each structural unit is provided with a first N-channel MOS transistor Q11, a first P-channel MOS transistor Q12 and a second N-channel MOS transistor Q13 every word lines W0 to Wn.

The drain of the N-channel MOS transistor Q11 is connected to a corresponding output of the predecoder circuit 2, the source of it is connected to one corresponding word line, and the gate of it is connected to the output (block selection line) of the inverter gate IV11.

The drain of the P-channel MOS transistor Q12 is connected to a corresponding output of the predecoder circuit 2, the source of it is connected to one corresponding word line, and the gate of it is connected to the output of the NAND gate G11.

Moreover, the drain of the N-channel MOS transistor Q13 is connected to one corresponding word line, the source of it is grounded, and the gate of it is connected to the output of the NAND gate G11.

Then, the read, write, and erase operations for the memory cell array 1 are described below. Tables 1 and 2 show the operating voltages of essential portions in each mode.

TABLE 1

Operating voltages in each mode

|  | Word line | Block selection line | Predecoder output | Main bit line | Source line |
|---|---|---|---|---|---|
| Read | VDD/0 V | VDD/0 V | VDD/0 V | 1 V/OPEN | 0 V/0 V |
| Write | VPP/0 V | VPP/0 V | VPP/0 V | 5 V/OPEN | 0 V/0 V |
| Erase | VEE/0 V | VDD/0 V | VEE/0 V | OPEN/OPEN | 5 V/0 V |

TABLE 2

Operating voltages in each mode

|  | VBN | VBP |
|---|---|---|
| Read | 0 V | VDD |
| Write | 0 V | VPP |
| Erase | VEE | VDD |

In Table 1, the left side of symbol "/" denotes a voltage for selection and the right side of it shows a voltage for nonselection. Moreover, a voltage VBN in Table 2 denotes a voltage to be supplied to a P-well on which the N-channel transistors Q11 and Q13 are formed and a voltage VBP denotes a voltage to be supplied to an N-well on which the P-channel transistor Q12 is formed. These transistors are operated in the enhancement mode by these voltages.

First, in the data read mode, every address input to a NAND gate corresponding to a selected word line among the addresses input to the NAND gates G0 to Gn of the predecoder circuit 2 by address generation means (not shown) is set to "1". Thereby, the output signal of the NAND gate becomes "L"-level and a positive voltage VDD (e.g. 3 V) is output to the output of the inverter gate connected to the NAND gate.

However, every address input to a NAND gate corresponding to a nonselected word line among the addresses input to the NAND gates G0 to Gn is set to "0". Thereby, the output signal of the NAND gate becomes "H"-level and 0 V is output to the output of the inverter gate connected to the NAND gate.

Therefore, a positive voltage VDD is output to the output of the predecoder circuit 2 corresponding to a selected word line and 0 V is output to the output of the predecoder circuit 2 corresponding to a nonselected word line.

Moreover, every address input to the NAND gate G11 of a block decoder circuit corresponding to a block including a selected word line among the addresses input to the block decoder circuits 3a and 3b by address generation means (not shown) is set to "1". Thereby, the output signal of the NAND gate G11 becomes "L"-level and a voltage VDD is output to the output of the inverter gate IV11 connected to the gate G11.

However, one address or more input to the NAND gate G11 of a block decoder circuit corresponding to a block including no selected word line among the addresses input to the block decoder circuits 3a and 3b is or are set to "0". Thereby, the output signal of the NAND gate G11 becomes "H"-level and 0 V is output to the output of the inverter gate IV11 connected to the gate G11.

Therefore, a voltage VDD is output to a block selection line corresponding to a block including a selected word line as a block selection signal and 0 V is output to a block selection line corresponding to a block including no selected word line.

Moreover, the Y decoder 5 applies 1 V to a main bit line to be selected among the main bit lines B0 to Bm to open a nonselected main bit line. Moreover 0 V is applied to every source line SL by voltage generation means (not shown).

Because the output of the NAND gate G11 of a block decoder circuit corresponding to a block including a selected word line becomes "L"-level and a block selection signal is set to VDD, the N-channel transistor Q11 and the P-channel transistor Q12 each of which is a structural unit corresponding to a block including a selected word line in the structural units 4a and 4b of a main decoder circuit are both turned on.

In this case, a voltage VDD is output to the output of the predecoder circuit 2 corresponding to a selected word line and 0 V is output to an output corresponding to a nonselected word line. Therefore, the voltage VDD is applied to the selected word line in the block through the drains and sources of the transistors Q11 and Q12 and 0 V is applied to the nonselected word line.

Moreover, because the output of the NAND gate G11 of a block decoder circuit corresponding to a block including no selected word line is set to "H" and a block selection signal is 0 V, the transistors Q11 and Q12 each of which is a structural unit corresponding to a block including no selected word line in the structural units 4a and 4b of a main decoder circuit are all turned off and the N-channel transistors Q13 each of which is a structural unit are all turned on. Therefore, a ground voltage of 0 V is applied to a nonselected word line corresponding to the block through the sources and drains of the transistors Q13.

Moreover, a voltage VDD is output to a block selection line corresponding to a block including a selected word line and 0 V is output to a block selection line corresponding to a block including no selected word line. Therefore, the N-channel transistors Q0 to Qm in a block including a selected word line in the memory cell array 1 are turned on and the N-channel transistors Q0 to Qm in a block including no selected word line are turned off.

Thus, a voltage VDD is applied to control gates of the memory cell transistors selected by a selected word line and selected main bit line among the memory cell transistors M00 to Mnm in a block selected by a block selection line, 1 V is applied to the drains of them through drains and sources of the transistors Q0 to Qm and the auxiliary bit lines SB0 to SBm, and 0 V is applied to sources of them through a source line SL. As a result, potentials of the drain of the selected memory cell transistor are changed in accordance with the number of electrons in the floating gate of the transistor and thereby, data is read.

Then, in the data write mode, every address input to a NAND gate corresponding to a selected word line among the addresses input to the NAND gates G0 to Gn of the predecoder circuit 2 is set to "1" by address generation means. Thereby, a positive voltage VPP (e.g. 12 V) is applied to the output of the inverter gate connected to the NAND gate.

However, one address or more input to a NAND gate corresponding to a nonselected word line among the addresses input to the NAND gates G0 to Gn is or are set to "0". Thereby, 0 V is output to the output of the inverter gate connected to the NAND gate.

Therefore, a positive voltage VPP is output to the output of the predecoder circuit 2 corresponding to a selected word line and 0 V is output to an output corresponding to a nonselected word line.

Moreover, every address input to the NAND gate G11 of a block decoder circuit corresponding to a block including a selected word line among the addresses input to the block decoder circuits 3a and 3b is set to "1" by address generation means. Thereby, a voltage VPP is output to the output of the inverter gate IV11 connected to the NAND gate G11.

However, one address or more input to the NAND gate G11 of a block decoder circuit corresponding to a block including no selected word line out of the addresses input to the block decoder circuits 3a and 3b is or are set to "0". Thereby, 0 V is output to the output of the inverter gate IV11 connected to the NAND gate G11.

Therefore, a voltage VPP is output to a block selection line corresponding to a block including a selected word line as a block selection signal and 0 V is output to a block selection line corresponding to a block including no selected word line.

Moreover, the Y decoder 5 applies 5 V to a main bit line to be selected among the main bit lines B0 to Bm to open a nonselected main bit line. Moreover, 0 V is applied to every source line SL by voltage generation means.

As a result, because the output of the NAND gate G11 of a block decoder circuit corresponding to a block including a selected word line is set to "L" and a block selection signal is set to VPP, the N-channel transistor Q11 and P-channel transistor Q12 each of which is a structural unit corresponding to a block including a selected word line in the structural units 4a and 4b of a main decoder circuit are all turned on. Thereby, a voltage VPP is applied to the selected word line in the block through the drains and sources of the transistors Q11 and Q12 and 0 V is applied to a nonselected word line.

Moreover, because the output of the NAND gate G11 of a block decoder circuit corresponding to a block including no selected word line is set to "H" and a block selection signal is set to 0 V, the N-channel transistors Q13 which is a structural unit corresponding to a block including no selected word line in the structural units 4a and 4b of a main decoder circuit are all turned on. Therefore, a ground voltage of 0 V is applied to the nonselected word line corresponding to the block through the source and drain of the transistor Q13.

Moreover, a voltage VPP is output to a block selection line corresponding to a block including a selected word line and 0 V is output to a block selection line corresponding to a block including no selected word line. Therefore, the N-channel transistors Q0 to Qm in a block including a selected word line in the memory cell array 1 are turned on and the N-channel transistors Q0 to Qm in a block including no selected word line are turned off.

Thus, a voltage VPP is applied to the control gate of a memory cell transistor selected by a selected word line and selected main bit line among the memory cell transistors M00 to Mnm in a block selected by a block selection line, 5 V is applied to the drain of it through the drains and sources of the transistors Q0 to Qm and auxiliary bit lines SB0 to SBm, and 0 V is applied to the source of it through a source line SL. As a result, electrons are injected into the floating gate of the selected memory cell transistor and data "1" is written.

Then, in the erase mode, every address input to a NAND gate corresponding to a selected word line among the addresses input to the NAND gates G0 to Gn of the predecoder circuit 2 by address generation means is set to "1". Thereby, a negative voltage VEE (e.g. −10 V) is output to the output of the inverter gate connected to the NAND gate.

However, one address or more input to a NAND gate corresponding to a nonselected word line among the addresses input to the NAND gates G0 to Gn is or are set to "0". Thereby, 0 V is output to the output of the inverter gate connected to the NAND gate.

Therefore, a negative voltage VEE is output to the output of the predecoder circuit 2 corresponding to a selected word line and 0 V is output to an output corresponding to a nonselected word line.

Moreover, every address input to the NAND gate G11 of a block decoder circuit corresponding to a block including a selected word line among the addresses input to the block decoder circuits 3a and 3b by address generation means is set to "1". Thereby, a voltage VDD is output to the output of the inverter gate IV11 connected to the NAND gate G11.

However, one address or more input to the NAND gate G11 of a block decoder circuit corresponding to a block including no selected word line among the addresses input to the block decoder circuits 3a and 3b is or are set to "0". Thereby, 0 V is output to the output of the inverter gate IV11 connected to the NAND gate G11.

Therefore, a voltage VDD is output to a block selection line corresponding to a block including a selected word line as a block selection signal and 0 V is output to a block selection line corresponding to a block including no selected word line.

Moreover, the Y decoder 5 opens all the main bit lines B0 to Bm. Then, 5 V is applied to a source line SL connected to the source of a selected memory cell transistor by voltage generation means and 0 V is applied to a source line SL not connected to the selected memory cell transistor.

As a result, because the output of the NAND gate G11 of a block decoder circuit corresponding to a block including a selected word line is set to "L" and a block selection signal is set to VDD, the N-channel transistor Q11 and P-channel transistor Q12 each of which is a structural unit corresponding to a block including a selected word line in the structural units 4a and 4b of a main decoder circuit are all turned on. Thereby, a negative voltage VEE is applied to a selected word line in the block through the drains and sources of the transistors Q11 and Q12 and 0 V is applied to a nonselected word line.

Moreover, because the output of the NAND gate G11 of a block decoder circuit corresponding to a block including no selected word line is set to "H" and a block selection signal is set to 0 V, the N-channel transistors Q13 each of which is a structural unit corresponding to a block including no selected word line in the structural units 4a and 4b of a main decoder circuit are all turned on. Thereby, a ground voltage of 0 V is applied to a nonselected word line corresponding to the block through the source and drain of the transistor Q13.

Then, a voltage VDD is output to a block selection line corresponding to a block including a selected word line and 0 V is output to a block selection line corresponding to a block including no selected word line. Therefore, in the memory cell array 1, the N-channel transistors Q0 to Qm in a block including a selected word line are turned on and the N-channel transistors Q0 to Qm in a block including no selected word line are turned off.

Thus, a negative voltage VEE is applied to the control gate of a memory cell transistor selected by a selected word line and selected source line among the memory cell transistors M00 to Mnm in a block selected by a block selection line, the drain of it is opened, and 5 V is applied to the source of it through a source line SL. As a result, electrons in the floating gate of the selected memory cell transistor are tunnel-discharged to the source of it and data "1" is erased.

Therefore, by selecting all word lines and all source lines in a selected block, it is possible to erase the data for every memory cell transistor in the block, thereby erasing the block.

As described above, in the case of the flash EEPROM of this embodiment, by providing the main bit lines B0 to Bm, auxiliary bit lines SB0 to SBm, the N-channel transistors Q0 to Qm for turning on/off the main bit lines and auxiliary bit lines, and the block decoders 3a and 3b for controlling the transistors Q0 to Qm to select a block for the memory cell array 1, it is possible to select every auxiliary bit line in a predetermined block by a block decoder and moreover select any auxiliary bit line out of the auxiliary bit lines by a main bit line.

That is, because a memory cell transistor is not directly selected by a bit line like the case of a conventional memory, it is possible to decrease the capacity of a main bit line and read data at a high speed. Because only auxiliary bit lines in a selected block are connected to main bit lines by the N-channel transistors Q0 to Qm in each block and auxiliary bit lines in a nonselected block are disconnected from the main bit lines, the capacity of a main bit line is decreased.

Moreover, the flash EEPROM of this embodiment prevents the drain disturbing phenomenon which erroneously erases the data in a nonselected memory cell transistor from occurring because of the above structure.

Therefore, in the case of the flash EEPROM in FIG. 5, it is unnecessary to supply a voltage of 3 V to a nonselected word line when data is erased and it is only necessary to supply 0 V. Therefore, it is only necessary to ground the source of the N-channel transistor Q13, the P-channel transistor Q44 in FIG. 5 is unnecessary, and a power supply for supplying 3 V is also unnecessary. Thus, it is possible to decrease the number of transistors per word line from 4 transistors of Q41 to Q44 to 3 transistors of Q11 to Q13.

In the case of this embodiment, voltages output from the inverter gates IV0 to IVn and IV11 have various values in each mode. However, it is possible to change these values by a switching circuit (not shown) in an inverter gate.

Figure 2:
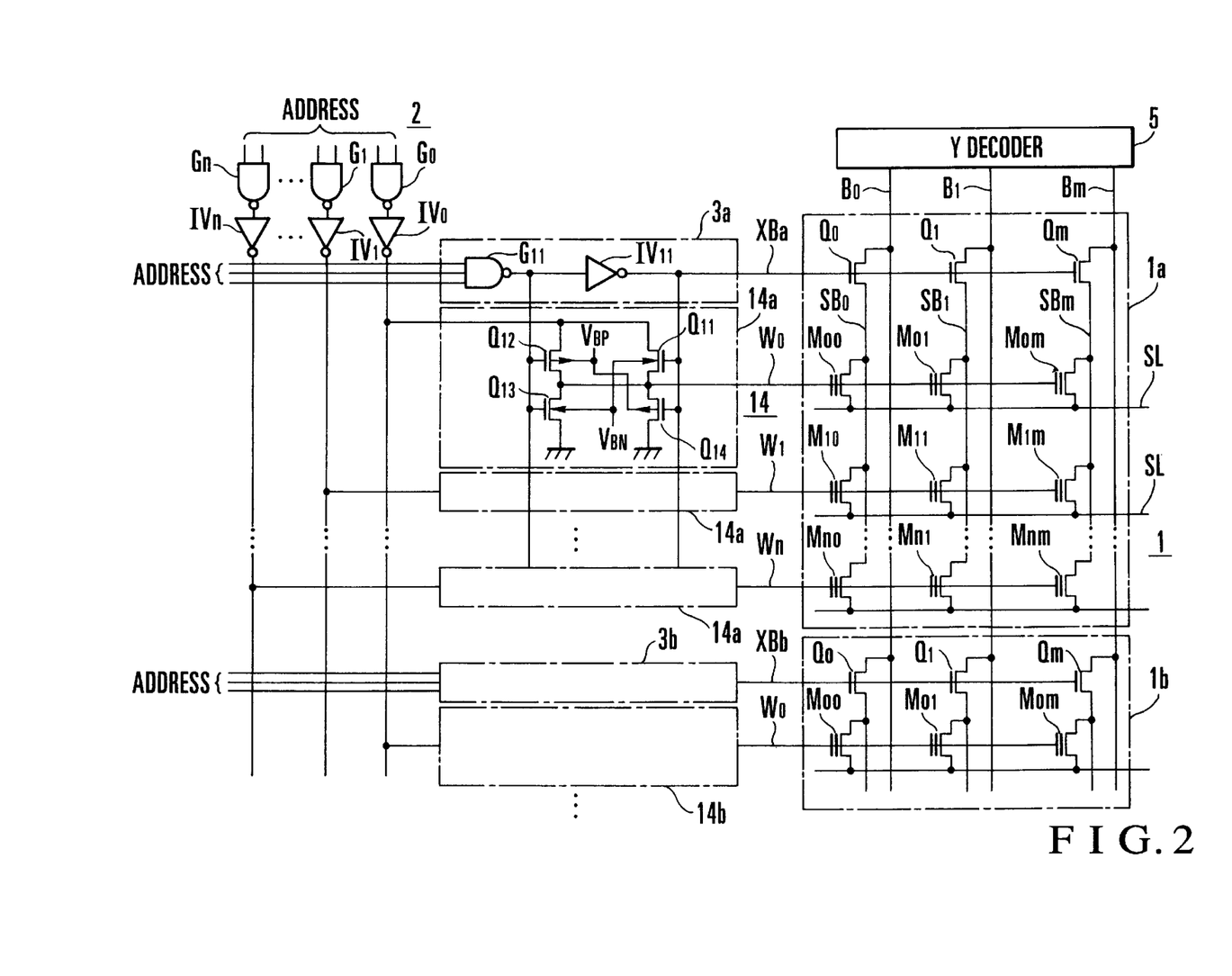
FIG. 2 is a block diagram of a flash EEPROM showing another embodiment of the present invention.

FIG. 2 is a block diagram of the flash EEPROM showing another embodiment of the present invention, in which a structure the same as that in FIG. 1 is provided with the same reference numerals.

In the case of the flash EEPROM of this embodiment, a main decoder circuit 14 comprises structural units 14a and 14b corresponding to the blocks 1a and 1b respectively and each structural unit is provided with the first N-channel MOS transistor Q11, first P-channel MOS transistor Q12, second N-channel MOS transistor Q13, and second P-channel MOS transistor Q14 for every word lines W0 to Wn.

That is, this embodiment is constituted by adding the transistor Q14 to the flash EEPROM in FIG. 1. The drain of the transistor Q14 is connected to one corresponding word line, the source of it is grounded, and the gate of it is connected to the output of the inverter gate IV11.

In the case of the flash EEPROM in FIG. 1, the threshold voltage of the N-channel transistor Q13 may be raised due to a voltage VBN and the transistor Q13 may not be easily turned on when no word line is selected. Therefore, it is possible to realize a secure on-state by adding the P-channel MOS transistor Q14.

Figure 3:
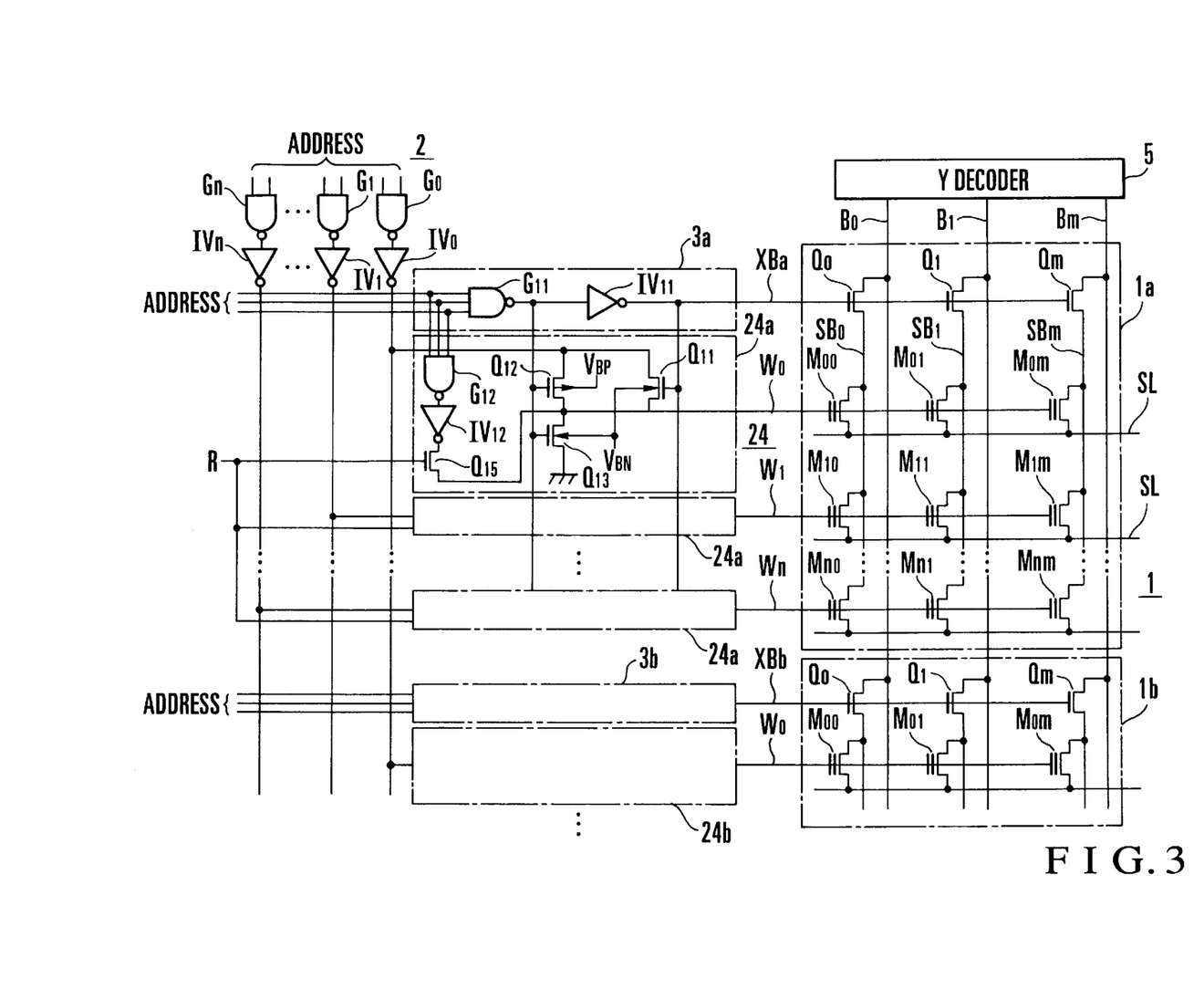
FIG. 3 is a block diagram of a flash EEPROM showing still another embodiment of the present invention.

FIG. 3 is a block diagram of the flash EEPROM showing still another embodiment of the present invention, in which a structure the same as that in FIG. 1 is provided with the same reference numerals.

In the case of the flash EEPROM of this embodiment, a main decoder circuit 24 comprises structural units 24a and 24b corresponding to the blocks 1a and 1b respectively and each structural unit is provided with the transistors Q11 to Q13, NAND gates G12, inverter gate IV12, and third N-channel MOS transistor Q15 for every word lines W0 to Wn.

The NAND gate G12 computes the NOR of an address input to a corresponding block decoder circuit and the inverter gate IV12 inverts the output signal of the NAND gate G12. Moreover, the drain of the N-channel transistor Q15 is connected to the output of the inverter gate IV12, the source of it is connected to one corresponding word line, and a read signal R is input to the gate of the transistor Q15.

The read signal R becomes "H"-level in the read mode. Thus, by adding the NAND gate G12, inverter gate IV12, and N-channel transistor Q15 to the flash EEPROM in FIG. 1, it is possible to more quickly read data. The read signal R is common to all word lines.

This is because the read speed is decreased in the case of the flash EEPROM in FIG. 1 because various load capacities are connected to word lines but a selected word line can be directly selected by the transistor Q15 in the case of this embodiment.

Figure 4:
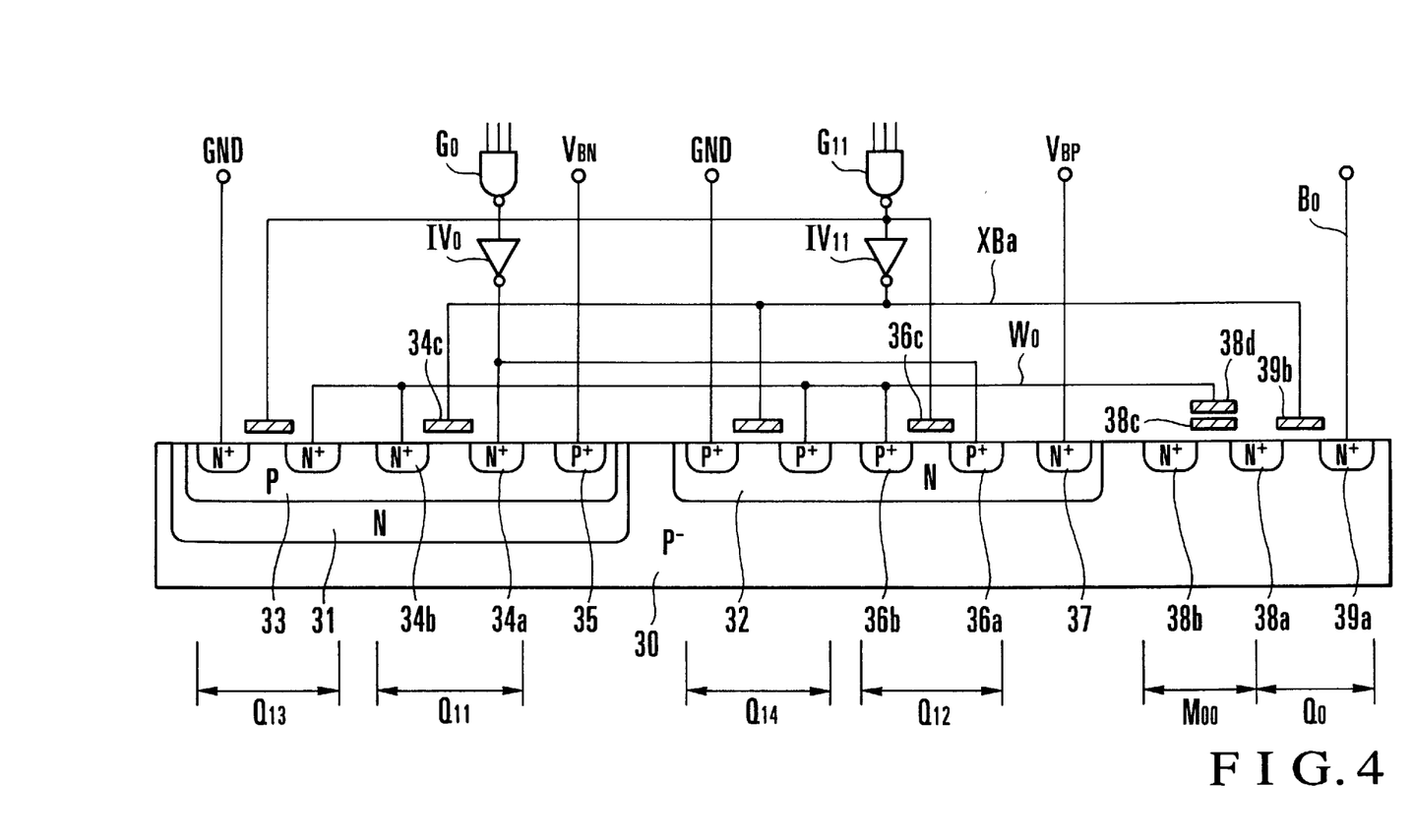
FIG. 4 is a sectional view showing the device structure of a part of the flash EEPROM in FIG. 2 formed on a semiconductor substrate.

FIG. 4 is a sectional view showing structures of some devices of the flash EEPROM in FIG. 2 formed on a semiconductor substrate and a structure the same as that in FIG. 2 is provided with the same reference numerals.

A ground voltage of 0 V is supplied to a substrate 30 made of P$^-$-type Si. Symbols 31 and 32 denote N-wells and 33 denotes a P-well.

The N-channel MOS transistors Q11 and Q13 are formed in the P-well 33. Moreover, the N-channel MOS transistor Q11 comprises a drain region 34a made of N$^+$-type Si, a source region 34b made of N$^+$-type Si, a gate electrode 34c made of poly-Si, and an insulating film (not shown) formed between an Si region and the gate electrode 34c. The same is true for the N-channel transistor Q13. Moreover, a P$^+$-type Si region 35 is formed in the P-well 33 and a voltage VBN is supplied to the region 35.

The P-channel MOS transistors Q12 and Q14 are formed in the N-well 32. Moreover, the P-channel MOS transistor Q12 comprises a drain region 36a made of P$^+$-type Si, a source region 36b made of P$^+$-type Si, a gate electrode 36c made of poly-Si, and an insulating film (not shown) formed between an Si region and the gate electrode 36c. The same is true for the P-channel transistor Q14. Moreover, an N$^+$-type Si region 37 is formed in the N-well 32 and a voltage VBP is supplied to the region 37.

The memory cell transistor M00 comprises a drain region 38a made of N$^+$-type Si, a source region 38b made of N$^+$-type Si, a floating gate 38c, a control gate 38d, and insulting films (not shown) formed between an Si region and the floating gate and between the floating gate and the control gate.

Moreover, the N-channel MOS transistor Q0 comprises a drain region 39a made of N$^+$-type Si (a source region is shared with the drain region 38a of the memory cell transistor M00), a gate electrode 39b made of poly-Si, and an insulating film (not shown) formed between an Si region and the gate electrode 39b.

FIG. 4 shows sectional structures of the devices in FIG. 2. It is needless to say that it is possible to form the devices in FIGS. 1 or 3 in the same manner.

The above embodiments use the type of memory cell transistor for applying a positive voltage VPP to the control gate of a selected cell and 0 V to the control gate of a nonselected cell in the write mode and applying a negative voltage VEE to the control gate of the selected cell and 0 V to the control gate of the nonselected cell in the erase mode. However, it is also possible to use the type of memory cell transistor in which the voltage for write and the voltage for erase are opposite to each other (that is, in Tables 1 and 2, the write mode serves as the erase mode and the erase mode serves as the write mode).

According to the present invention, it is possible to prevent the drain disturbing phenomenon by constituting a nonvolatile semiconductor storage with a memory cell array comprising a plurality of blocks and having a plurality of memory cell transistors and a plurality of N-channel transistors in each block, a word line, a main bit line, and an X decoder comprising a predecoder, block decoder, and main decoder. Therefore, it is unnecessary to supply a voltage VWL of 3 V to a nonselected word line like the case of a conventional nonvolatile semiconductor storage and wiring for supplying the voltage VWL is unnecessary. As a result, it is possible to simplify the structure of the X decoder and decrease the area of the X decoder. Moreover, it is unnecessary to use a power supply for generating the voltage VWL. Furthermore, it is possible to decrease the number of transistors per word line in the X decoder from conventional four transistors to three transistors of first N-channel transistor, first P-channel transistor, and second N-channel transistor. Therefore, it is possible to further simplify the X decoder.

Moreover, it is possible to securely set a nonselected word line to 0 V because a main decoder has a second P-channel transistor for each word line.

Furthermore, it is possible to more quickly read data because a main decoder has a NAND gate, inverter gate, and third N-channel transistor for each word line.

What is claimed is:

1. A nonvolatile semiconductor storage comprising:
    a memory cell array provided with a plurality of blocks, each block including a plurality of memory cell transistors arranged like a matrix and with a plurality of N-channel transistors whose sources are connected to an auxiliary bit line common to the drains of said memory cell transistors of each column;
    a word line connected to control gates of memory cell transistors of each row of said memory cell array in common;
    main bit line connected to drains of N-channel transistors of each column of said memory cell array in common; and
    an X decoder including a predecoder for selecting a predetermined word line in accordance with an input address, a block decoder for selecting one of said blocks by outputting a block selection signal to the N-channel transistor of said selected block in accordance with an input address, and a main decoder for selecting a predetermined word line in accordance with the output of said predecoder or block decoder,
    wherein said main decoder includes:
        a first N-channel transistor whose drain is connected to a corresponding output of the predecoder, whose source is connected to one corresponding word line, and to whose gate a block selection signal is input for each word line;
        a first P-channel transistor whose drain is connected to a corresponding output of said predecoder, whose source is connected to one corresponding word line, and to whose gate the inverted signal of said block selection signal is input; and
        a second N-channel transistor whose drain is connected to one corresponding word line, whose source is grounded, and to whose gate the inverted signal of said block selection signal is input, for each word line.

2. The nonvolatile semiconductor storage according to claim 1, wherein
    said main decoder has a second P-channel transistor whose drain is connected to one corresponding word line, whose source is grounded, and to whose gate said block selection signal is input, for each word line.

3. The nonvolatile semiconductor storage according to claim 1, wherein said main decoder includes:
    a NAND gate for computing the NOR of an address input to said block decoder;
    inverter gate for inverting the output signal of said NAND gate; and
    a third N-channel transistor whose drain is connected to the output of said inverter gate, whose source is connected to one corresponding word line, and to whose gate a read signal is input, for each word line.

4. A nonvolatile semiconductor storage comprising:
    a memory cell array provided with a plurality of blocks, each block including a plurality of memory cell transistors arranged like a matrix and with a plurality of first-channel transistors whose sources are connected to an auxiliary bit line common to the drains of said memory cell transistors of each column;
    a word line connected to control gates of memory cell transistors of each row of said memory cell array in common;
    a main bit line connected to drains of first-channel transistors of each column of said memory cell array in common; and
    an X decoder including a predecoder for selecting a predetermined word line in accordance with an input address, a block decoder for selecting one of said blocks by outputting a block selection signal to the first-channel transistor of said selected block in accordance with an input address, and a main decoder for selecting a predetermined word line in accordance with the output of one of said predecoder and block decoder,
    wherein said main decoder includes:
        a first first-channel transistor whose drain is connected to a corresponding output of the predecoder, whose source is connected to one corresponding word line, and to whose gate a block selection signal is input for each word line;
        a first second-channel transistor whose drain is connected to a corresponding output of said predecoder, whose source is connected to one corresponding word line, and to whose gate the inverted signal of said block selection signal is input; and
        a second first-channel transistor whose drain is connected to one corresponding word line, whose source is grounded, and to whose gate the inverted signal of said block selection signal is input, for each word line.

5. The nonvolatile semiconductor storage according to claim 4, wherein said main decoder includes a second second-channel transistor whose drain is connected to one corresponding word line, whose source is grounded, and to whose gate said block selection signal is input, for each word line.

6. The nonvolatile semiconductor storage according to claim 4, wherein said main decoder includes:

a NAND gate for computing the NOR of an address input to said block decoder;

an inverter gate for inverting the output signal of said NAND gate; and a third first-channel transistor whose drain is connected to the output of said inverter gate, whose source is connected to one corresponding word line, and to whose gate a read signal is input, for each word line.

7. The nonvolatile semiconductor storage according to claim 4, wherein said first-channel transistor comprises an N-channel transistor and wherein said second-channel transistor comprises a P-channel transistor.

* * * * *